(12) United States Patent
Lin

(10) Patent No.: US 9,916,878 B2
(45) Date of Patent: Mar. 13, 2018

(54) METHODS AND SYSTEMS FOR PARALLEL COLUMN TWIST INTERLEAVING

(71) Applicant: MaxLinear, Inc., Carlsbad, CA (US)

(72) Inventor: Jian-Hung Lin, Laguna Niguel, CA (US)

(73) Assignee: MAXLINEAR, INC., Carlsbad, CA (US)

(*) Notice: Subject to any disclaimer, the term of this patent is extended or adjusted under 35 U.S.C. 154(b) by 0 days.

(21) Appl. No.: 15/459,639

(22) Filed: Mar. 15, 2017

(65) Prior Publication Data

US 2017/0270979 A1    Sep. 21, 2017

Related U.S. Application Data

(60) Provisional application No. 62/308,252, filed on Mar. 15, 2016.

(51) Int. Cl.
*G11C 7/10*    (2006.01)
*G11C 7/22*    (2006.01)

(52) U.S. Cl.
CPC .......... *G11C 7/1012* (2013.01); *G11C 7/1057* (2013.01); *G11C 7/1084* (2013.01); *G11C 7/22* (2013.01)

(58) Field of Classification Search
CPC ... G11C 7/1012; G11C 7/1057; G11C 7/1084; G11C 7/22
See application file for complete search history.

(56) References Cited

U.S. PATENT DOCUMENTS

| | | | | |
|---|---|---|---|---|
| 7,995,410 B2* | 8/2011 | Campbell | ................ | G11C 7/04 365/189.11 |
| 8,285,945 B2* | 10/2012 | Rao | ......................... | G11C 7/10 710/38 |
| 2012/0066439 A1* | 3/2012 | Fillingim | ............ | G06F 11/3485 711/103 |
| 2012/0179883 A1* | 7/2012 | Ma | ...................... | G06F 13/1647 711/157 |

OTHER PUBLICATIONS

"A Programmable, Scalable-Throughput Interleaver", E.J.C. Rijshouwer et al., EURASIP Journal on Wireless Communications and Networking, vol. 2010, Article ID 513104, 16 pages.

* cited by examiner

*Primary Examiner* — Pho M Luu
(74) *Attorney, Agent, or Firm* — McAndrews, Held & Malloy, Ltd.

(57) ABSTRACT

Systems and methods are provided for parallel column twist interleaving. Parallel bit-interleaving with column twist may be applied to an input bitstream based on one or more interleaving parameters. Bits in the input bitstream may be read, in sets having size based on a first interleaving parameter, and may then be processed based on a second interleaving parameter. The processing may comprise applying a shift to a combination of bits that include a current bit set and additional bits corresponding to previously processed bit sets and/or pre-set bits. The shift may be determined based on a column twist associated with the current corresponding. Bits generated based on processing in current and/or previous cycles may be stored into memory, and bits may be read from the memory, based on a third interleaving parameter, for generating an output interleaved bitstream.

28 Claims, 11 Drawing Sheets

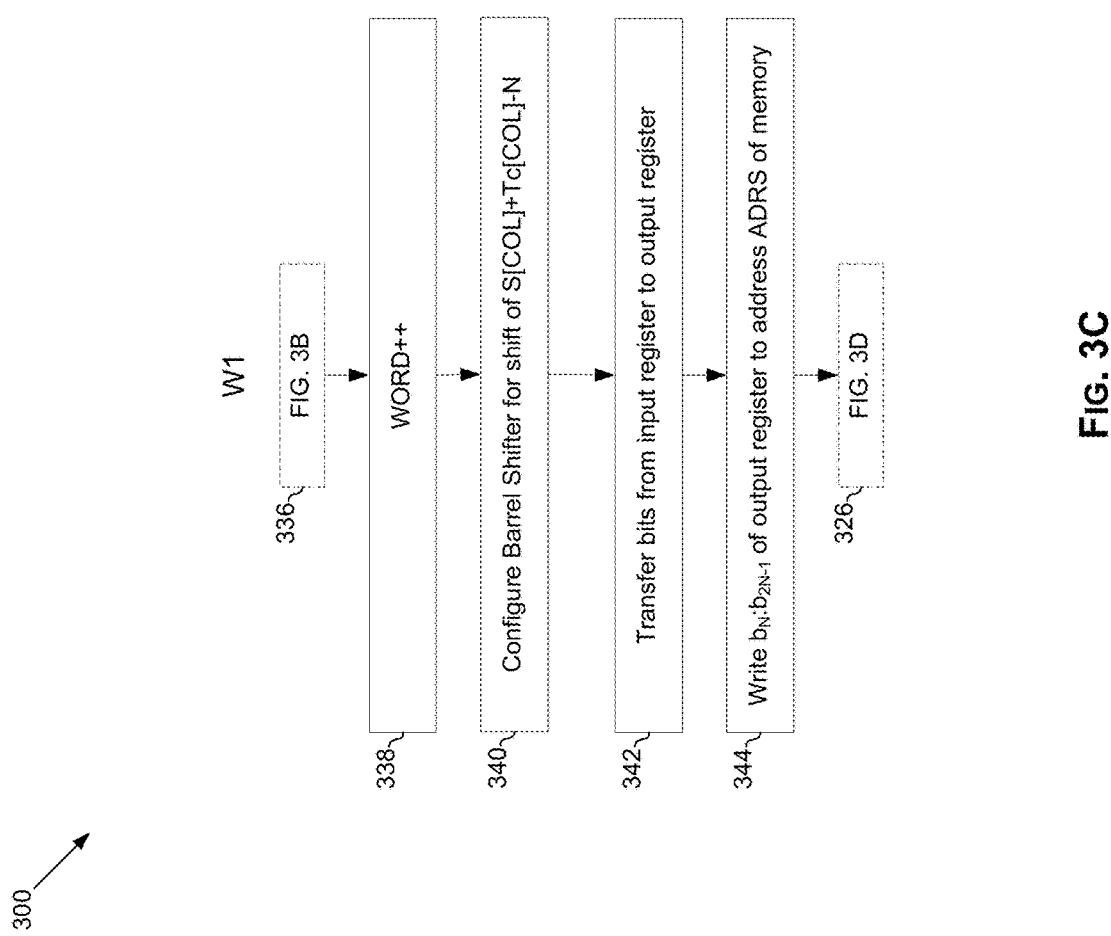

METHODS AND SYSTEMS FOR PARALLEL COLUMN TWIST INTERLEAVING

CLAIM OF PRIORITY

This patent application makes reference to, claims priority to and claims benefit from U.S. Provisional Patent Application Ser. No. 62/308,252, filed Mar. 15, 2016. The above identified application is hereby incorporated herein by reference in its entirety.

TECHNICAL FIELD

Aspects of the present disclosure relate to communications. More specifically, certain implementations of the present disclosure relate to methods and systems for parallel column twist interleaving.

BACKGROUND

Various issues may exist with conventional approaches for use of interleaving in communication solutions. In this regard, conventional approaches for use of interleaving may be costly, cumbersome, and/or inefficient. For example, conventional systems and methods, if any existed, for interleaving may be too costly for high throughput applications.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for parallel column twist interleaving, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIGS. 1A-1C illustrate parallel column twist interleaving.

FIGS. 3A-3F illustrate an example process for performing parallel column twist interleaving.

DETAILED DESCRIPTION OF THE INVENTION

Figure 2:
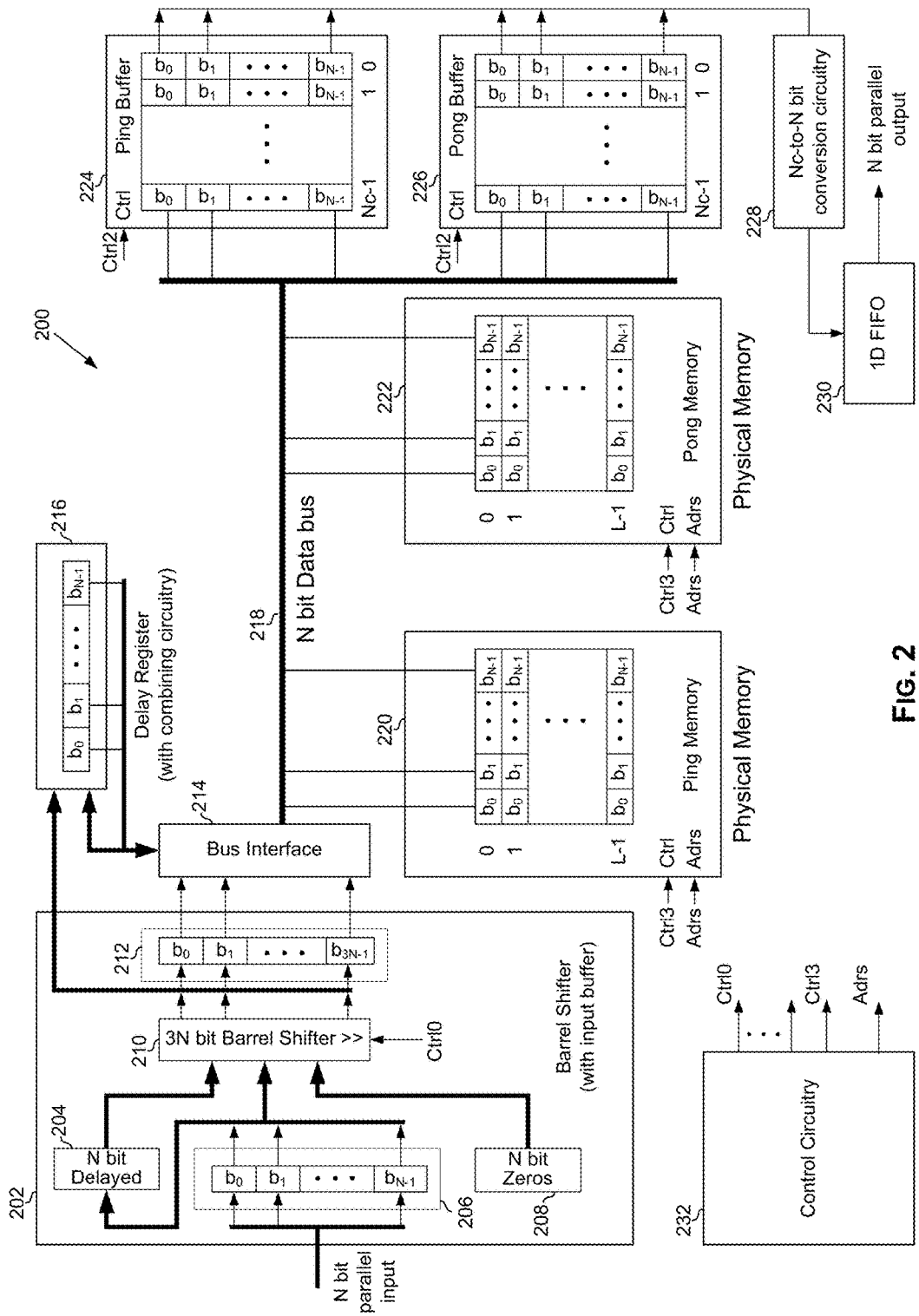
FIG. 2 illustrates example circuitry for performing parallel column twist interleaving.

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or." As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g.," set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1A:
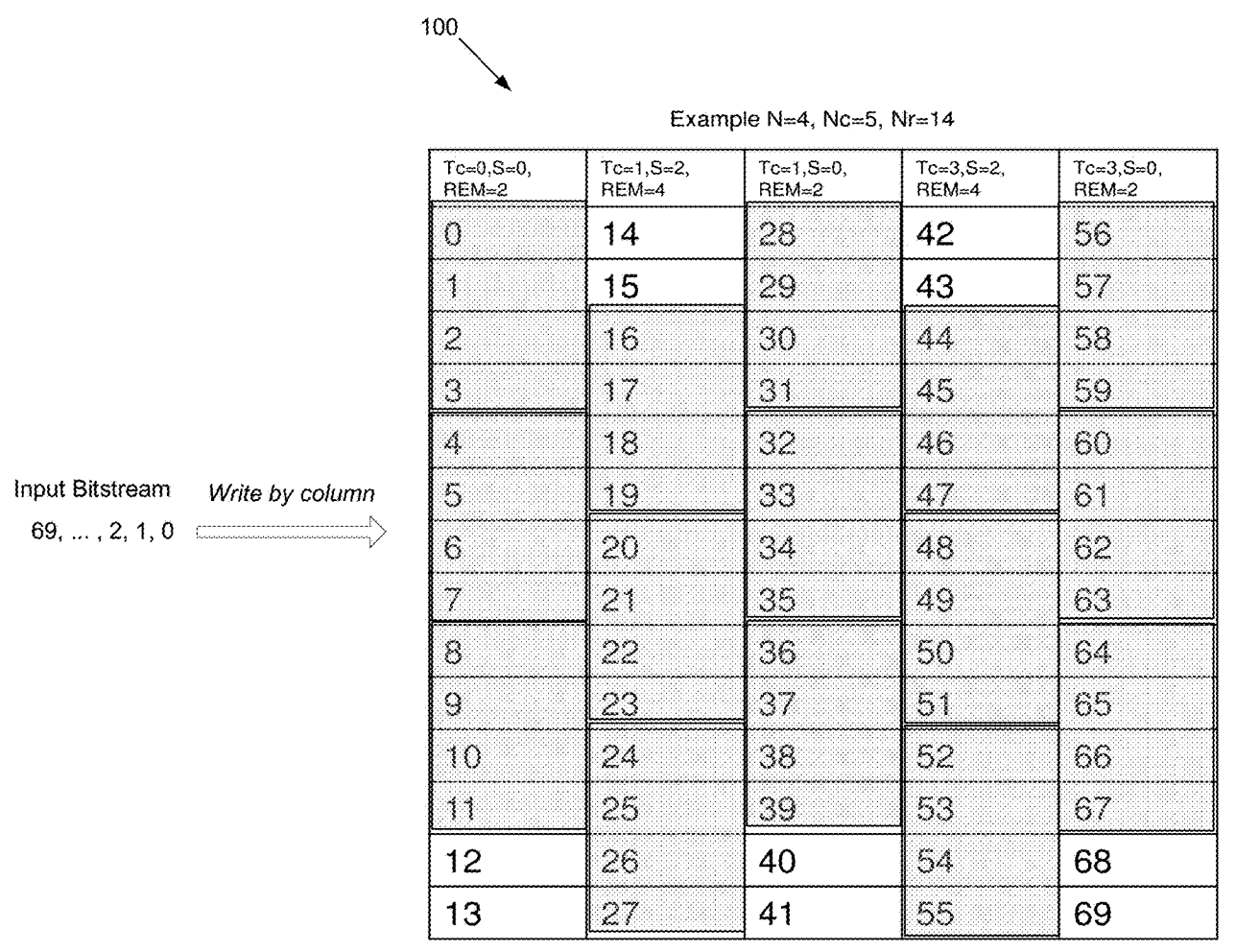
Figure 1B:
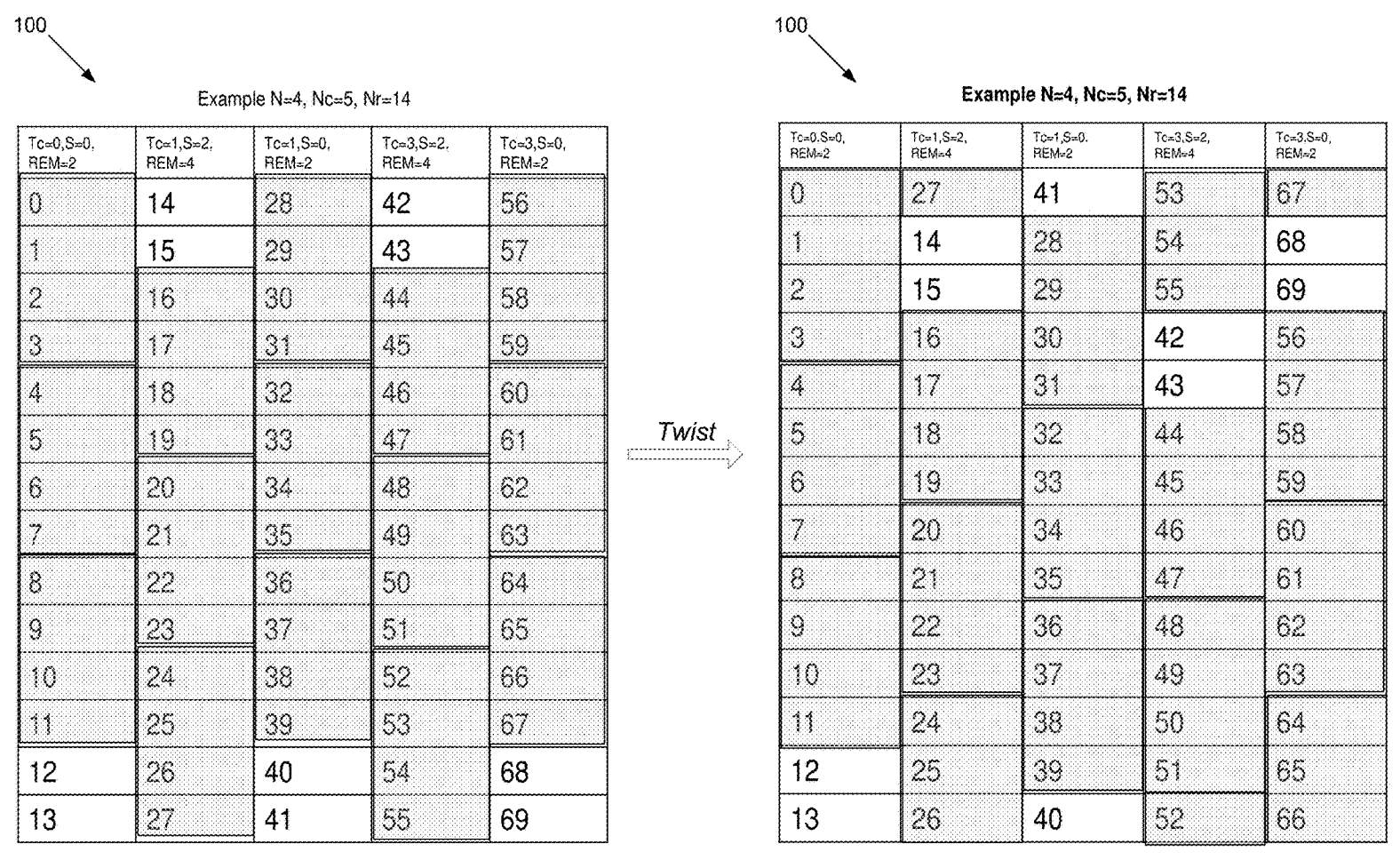
Figure 1C:
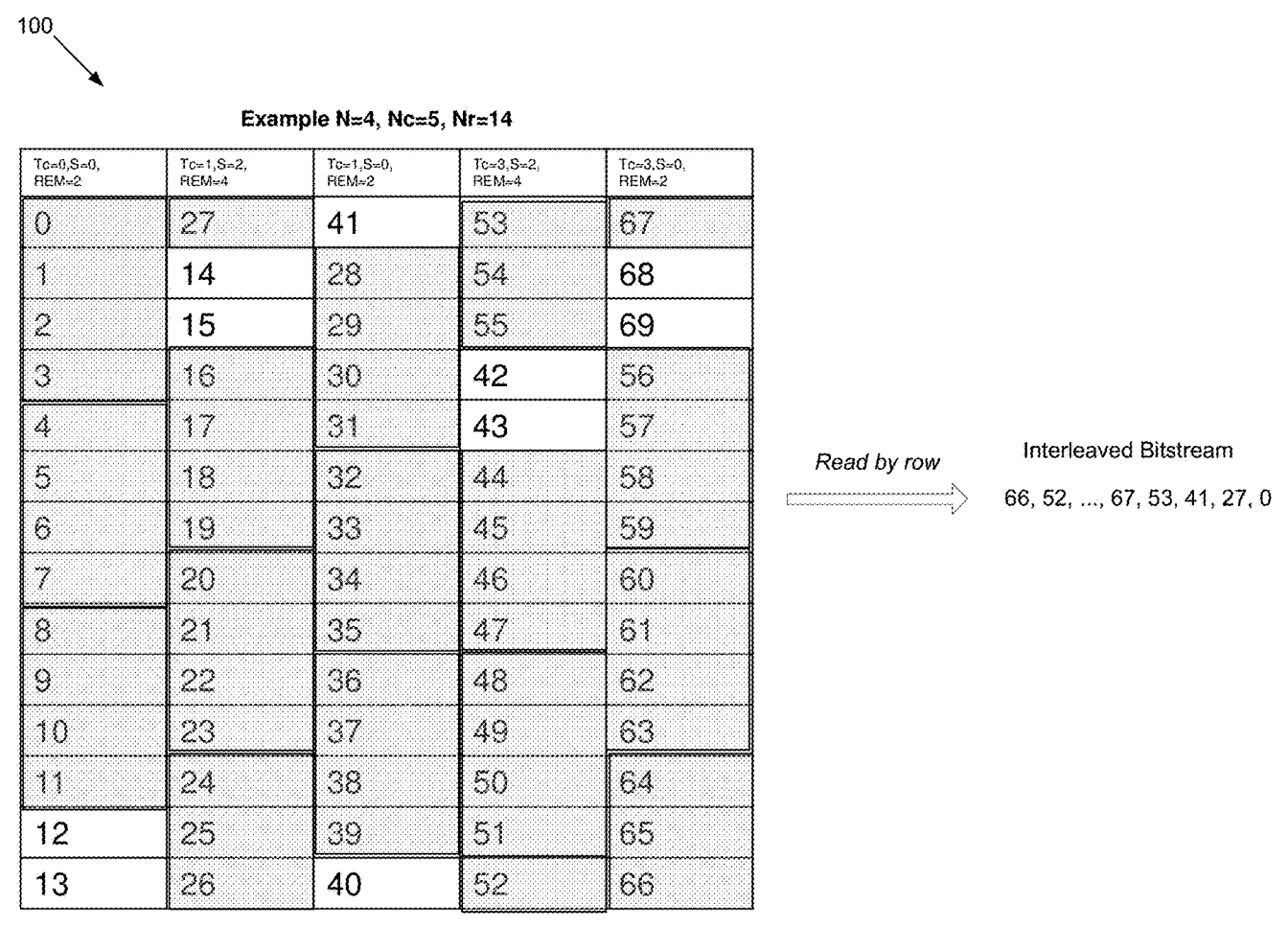

FIGS. 1A-1C illustrate parallel column twist interleaving. Shown in FIGS. 1A-1C is interleaving matrix 100, which may be used in conjunction with parallel column twist interleaving.

The parallel column twist interleaving is performed according to a variety of parameters which may, for example, be determined based on an applicable standard (e.g., as set forth by IEEE, 3GPP, and/or other standards bodies), a selected mode of operation (e.g., some standards specific multiple modes of operation), and/or context of the particular implementation (e.g., information about the source of the data to be interleaved, the device performing the interleaving, resources (e.g., codeword length, modulation order, signal to noise ratio, throughput, etc.) available for the interleaving, and/or the like). Such parameters may include (for the interleaving matrix 100):

N is the level of interleaving parallelism

Nr is the number of rows of the interleaving matrix 100

Nc is the number columns of the interleaving matrix 100

In an example implementation, interleaving is carried out using a plurality of variables, which may include:

COL is the current column being processed (e.g., in the interleaving matrix 100)

WORD is a counter used for addressing memory

BIT is counter used to assist in state transitions (e.g., determine when to transition between states)

S[COL] is the number of "starting units (e.g., bits)" for column COL, where S[0]=0, and S[COL+1]=mod(N-REM[COL], N)

REM[COL] is the number of "remainder units (e.g., bits)" for column COL, where REM[COL]=mod(Nr-S[COL], N), but if REM=0, then REM=N Tc[COL] is the column twist parameter for column COL ADRS is a physical memory address, where ADRS=WORD*Nc+COL L is memory length, where L =Nc_max*ceil(Nr_max/N). The Nc_max and Nr max are the maximal Nc and Nr for all possible configurations (e.g., based on standards, modes, contexts, etc.)

In FIG. 1A, data units to be interleaved are input to the interleaving matrix 100 column by column. As discussed below in FIG. 2, in an example implementation, there is no single memory that stores the entire interleaving matrix 100. Nevertheless, the interleaving matrix 100 in FIGS. 1A-1C is helpful for visualizing the interleaving process. For purposes of illustration, the data to be interleaved consists of 70 data units (e.g., bits) which are indexed from 0 to 69. For purposes of illustration, the parameters are as follows:

N=4

Nc=5

Nr=14

Tc[0]=0, Tc[1]=1, Tc[2]=1, Tc[3]=3, Tc[4]=3
S[0]=0, S[1]=2, S[2]=0, S[3]=2, S[4]=0
REM[0]=2, REM[1]=4, REM[2]=2, REM[3]=4, REM[4]=2

In FIG. 1B, after the data units to be interleaved have been written to the interleaving matrix 100, the twist is performed. For each column COL, the twist comprises cyclically shifting column COL such that the last Tc[COL] data units of column COL wrap to the top of column COL.

In FIG. 1C, the data units are read out of the interleaving matrix 100 row by row.

FIG. 2 illustrates example circuitry for performing parallel column twist interleaving. Shown in FIG. 2 is interleaving circuitry 200.

The interleaving circuitry 200 may comprise a barrel shifter with input buffer 202, bus interface circuitry 214, a register and combining logic 216, an N-bit data bus 218, memory array 220, memory array 222, buffer 224, buffer 226, Nc-to-N bit conversion circuitry 228, one-dimensional first-in-first-out (FIFO) buffer 230, and control circuitry 232.

The barrel shifter with input buffer 202 comprises an N-bit delay register 204, an N-bit input register 206, a N-bit zero-filled register 208, 3N-bit barrel shifter circuitry 210, and a 3N-bit output register 212. The N-bit delayed register 204 stores a previously-received N bits of the input stream and the input register 206 stores a currently-received N bits of the input stream. In response to a shift command, bits stored in the registers 204, 206, and 208 are shifted into the output register 212 in an order determined by the barrel shifter circuitry 210.

The bus interface circuitry 214 is operable to convey bits among the barrel shifter 202, the delay register 216, and the N-bit data bus 218.

The N-bit register and combining logic 216 is operable to store N-bits received from the bus interface 214 and make those bits available for later reading by the bus interface 214. The N-bit register and combining logic 216 is operable to combine currently stored bits (e.g., bits previously received from the bus interface 214) with bits later received from the bus interface 214.

The combining may result in modification of the contents of the register 216. For example, at the end of processing a particular column COL, the register 216 may store the first N-Tc bits of column COL and combine it with the last Tc bits from column COL such that, after the combining, bits $b_0$-$b_{Tc-1}$ of the register 216 store the last Tc bits of column COL and bits $b_{Tc}$-$b_{N-1}$ store the first N-Tc bits of column COL (e.g., at the end of processing column 1 in FIGS. 1B and 1C, the delay register 216 may store shifted N bits (?, 14, 15, and 16) and combine it with (?, ?, 27, ?) such that it stores bits (27, 14, 15, 16), where '?' represents unknowns/don't care).

Each of the memory arrays 220 and 222 comprises L×N memory locations organized as L rows of N bits each. The memory arrays 220 and 222 are read and written in ping-pong fashion such that: writes from bus interface 214 to memory array 220 overlap in time with reads from memory array 222 to ping pong buffer 224 and 226; and writes from bus interface 214 to memory array 222 overlap in time with reads from memory array 220 to ping pong buffer 224 and 226.

Each of the buffers 224 and 226 is configured to store Nc groups of N-bits each read from a respective one of memory arrays 220 and 222. The ping pong buffer is used to continuously read out either the ping pong memory 220 or 222 and send out interleaved result. The ping pong buffer input is vertically N bit each cycle and output is horizontally multiple Nc bits to approximate N (In actual application, N is usually larger than Nc).

The Nc-to-N bit conversion circuitry 228 is operable to convert the interleaving results (each is Nc bit wide) which are read out from one of the Ping Pong buffer (224 or 226) back into something approximately N bit wide and insert it into an 1D FIFO 230 to maintain N bit output per clock cycle without overflow or underflow. The conversion circuit 228 uses a small state machine to regularly read out approximately N bit from N×Nc bit buffer. Since N may not a multiple of Nc, regularly inserting less bits or stall is necessary.

The one-dimensional first-in-first-out (FIFO) buffer 230 is operable to buffer the output of the circuitry 228. The number of bits read from buffer 224 or 226 and into FIFO 230 (via conversion circuitry 228) in any cycle may depend on the parameters of the interleaving. In an example implementation, approximately N bits are read from buffer 224 or 226 into FIFO 230 during any given cycle. In an example implementation, slightly and regularly more than N bits may be read into FIFO 230 and then at the end of the buffer output remaining bits are inserted into FIFO 230 or stall is performed if there are no remaining bits to be read for the buffer.

The control circuitry 232 is operable to generate control signals that control operation of the interleaving circuitry. The control signals may be generated with aid of a state machine implemented by the control circuitry 232. In an example implementation, the state machine may have six states as described below with reference to FIGS. 3A-3F.

FIGS. 3A-3F illustrate an example process for performing parallel column twist interleaving.

Figure 3A:
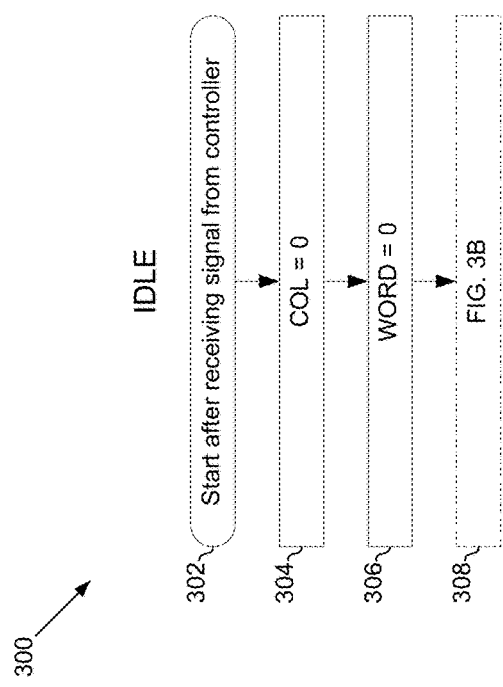

Referring to FIG. 3A, a first state (which may be referred to as state "IDLE") is illustrated. Operation in the IDLE state begins with start block 302. Then, in block 304, the COL variable is initialized to 0. In block 306, the WORD variable is initialized to 0. After block 306, the process advances to block 308 and the state machine advances to state WO, described with reference to FIG. 3B.

Figure 3B:
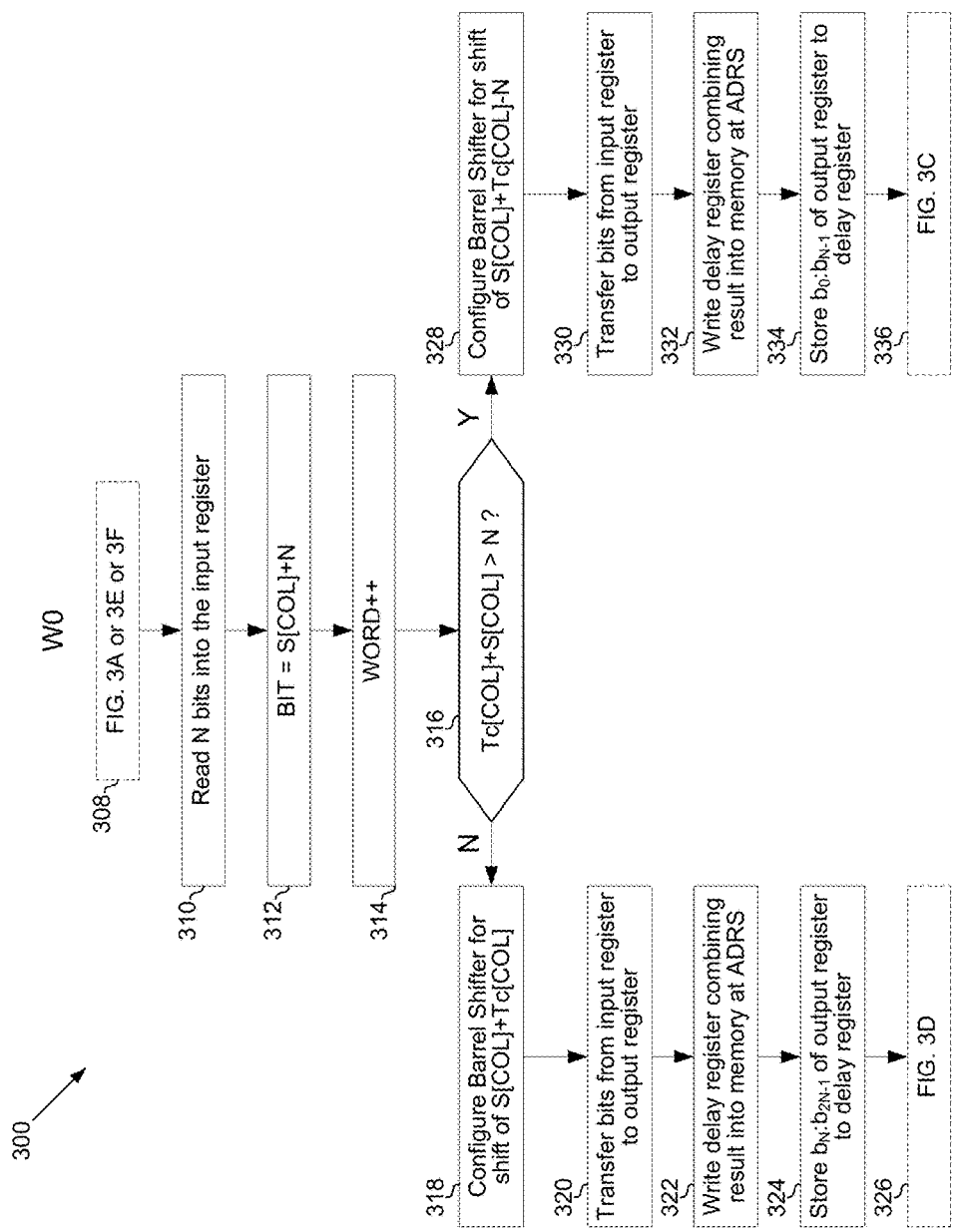

Now referring to FIG. 3B, a second state (which may be referred to as state "WO") is illustrated. After state entry block 308, the process advances to block 310 in which the bits of register 206 are copied into the register 204, and N new bits of the data stream are input to register 206.

Next, in block 312, the BIT variable is updated and, in block 314, the WORD variable is incremented.

After block 314, the process advances to block 316 in which it is determined whether Tc[COL]+S[COL] is greater than N. If not, then the process advances to block 318.

In block 318, shift control circuitry 210 is configured for a shift of S[COL]+Tc[COL] bits.

In block 320, bits of registers 204, 206, and 208 are transferred to register 212 and, in the process, shifted by S[COL]+Tc[COL] bits. For example, treating the registers 204, 206, and 208 as a logical register of 3N bits, the indexes of the bits in register 206 are $b_N \ldots b_{2N-1}$ and the corresponding bits in 3N-bit register 212 are $b_{N+(S[COL]+Tc[COL])} \ldots b_{2N-1+(S[COL]+Tc[COL])}$.

In block 322, the combining result in the delay register 216 is written to address (which corresponds to row number in the example implementation shown) ADRS=COL−1 in one of memory arrays 220 and 222. (Note, if COL=0 this block is skipped). Which of the memory arrays 220 and 222 is used depends on whether a ping memory or pong memory of the interleaving matrix is currently being processed (e.g., even memory may be ping memory and odd memory may be pong memory).

In block 324, bits $b_N \ldots b_{2N-1}$ of register 212 are stored to delay register 216.

After block 324, the process advances to block 326 and the state machine advances to state X, described with reference to FIG. 3D.

Returning to block 316, if Tc[COL]+S[COL] is greater than N, the process advances to block 328. In block 328, shift control circuitry 210 is configured for a shift of S[COL]+Tc[COL]−N bits.

In block 330, bits of registers 204, 206, and 208 are transferred to register 212 and, in the process, shifted by S[COL]+Tc[COL]−N bits. For example, treating the registers 204, 206, and 208 as a logical register of 3N bits, the indexes of the bits in register 206 are $b_N \ldots b_{2N-1}$ and the corresponding bits in 3N-bit register 212 are $b_{N+(S[COL]+Tc[COL]-N)} \ldots b_{2N-1+(S[COL]+Tc[COL]-N)}$.

In block 332, the combining result in the delay register 216 is written to address (which corresponds to row number in the example implementation shown) ADRS=COL−1 in one of memory arrays 220 and 222. (Note, if COL=0 this block is skipped). Which of the memory arrays 220 and 222 is used depends on whether a ping memory or pong memory of the interleaving matrix is currently being processed (e.g., even memory may be ping memory and odd memory may be pong memory).

In block 334, bits $b_0 \ldots b_{2N-1}$ of register 212 are written to delay register 216.

After block 334, the process advances to block 336 and the state machine advances to state W1, described with reference to FIG. 3D.

Now referring to FIG. 3C, a third state (which may be referred to as state "W1") is illustrated. After state entry block 336, the process advances to block 338 in which the WORD variable is incremented.

In block 340, the shift control circuitry 210 is configured for a shift of S[COL]+Tc[COL]−N bits.

In block 342, bits of registers 204, 206, and 208 are transferred to register 212 and, in the process, shifted by S[COL]+Tc[COL]−N bits. For example, treating the registers 204, 206, and 208 as a logical register of 3N bits, the indexes of the bits in register 206 are $b_N \ldots b_{2N-1}$ and the corresponding bits in 3N-bit register 212 are $b_{N-(S[COL]+Tc[COL]-N)} \ldots b_{2N-1-(S[COL]+Tc[COL]-N)}$.

In block 344, bits $b_N \ldots b_{2N-1}$ of register 212 are written to address (which corresponds to row number in the example implementation shown) ADRS of one of memory arrays 220 and 222. Which of the memory arrays 220 and 222 is used depends on whether a ping memory or pong memory of the interleaving matrix is currently being processed (e.g., even memory may be ping memory and odd memory may be pong memory).

After block 344, the process advances to block 326 and the state machine advances to state X, described with reference to FIG. 3D.

Figure 3D:
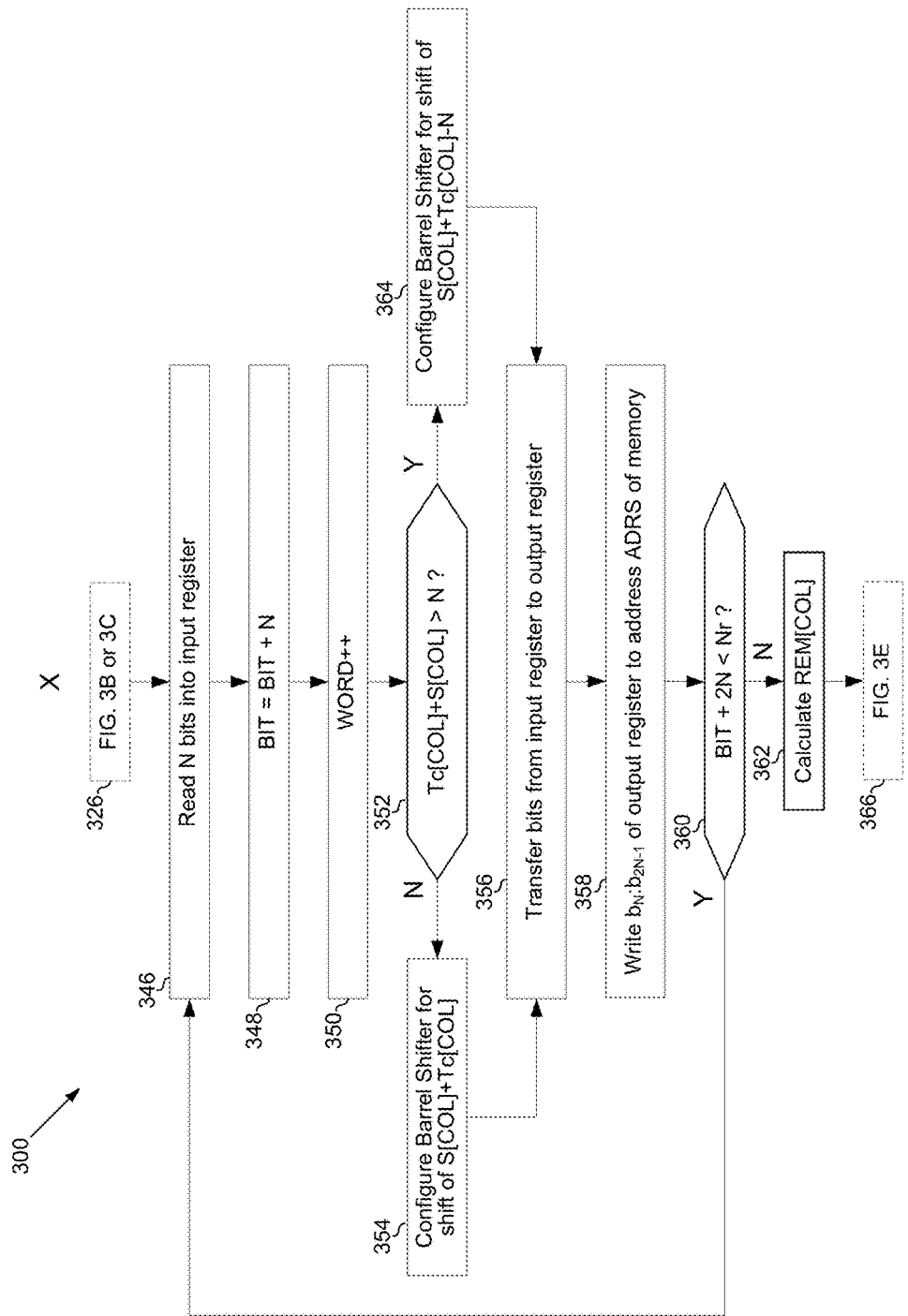

Now referring to FIG. 3D, after state entry block 326, the process advances to block 346 in which the bits of register 206 are copied into the register 204, and then N new bits of the data stream are input to register 206.

Next, in block 348, the BIT variable is updated and, in block 350, the WORD variable is incremented.

After block 350, the process advances to block 352 in which it is determined whether Tc[COL]+S[COL] is greater than N. If not, then the process advances to block 354.

In block 354, shift control circuitry 210 is configured for a shift of S[COL]+Tc[COL] bits. After block 354, the process advances to block 356.

Returning to block 352, if Tc[COL]+S[COL] is greater than N, then the process advances to block 364 in which shift control circuitry 210 is configured for a shift of S[COL]+Tc[COL]−N bits. After block 364, the process advances to block 356.

In block 356, bits of registers 204, 206, and 208 are transferred to register 212 and, in the process, shifted by either S[COL]+Tc[COL] bits, if block 356 was arrived at from block 354, or S[COL]+Tc[COL]−N if block 356 was arrived at from block 364.

In block 358, bits $b_N \ldots b_{2N-1}$ of register 212 are written to address (which corresponds to row number in the example implementation shown) ADRS of one of memory arrays 220 and 222. Which of the memory arrays 220 and 222 is used depends on whether a ping memory or pong memory of the interleaving matrix is currently being processed (e.g., even memory may be ping memory and odd memory may be pong memory).

In block 360, it is determined whether BIT+2N is less than Nr. If so, then process returns to block 346. If not, the process advances to block 362.

In block 362, REM[COL] is calculated. The REM can be calculated by Nr−BIT and then subtract/add multiple of N to bring it to the right range (1 to N). After block 362, the process advances to block 366 and the state machine advances to state R0, described with reference to FIG. 3E.

Figure 3E:
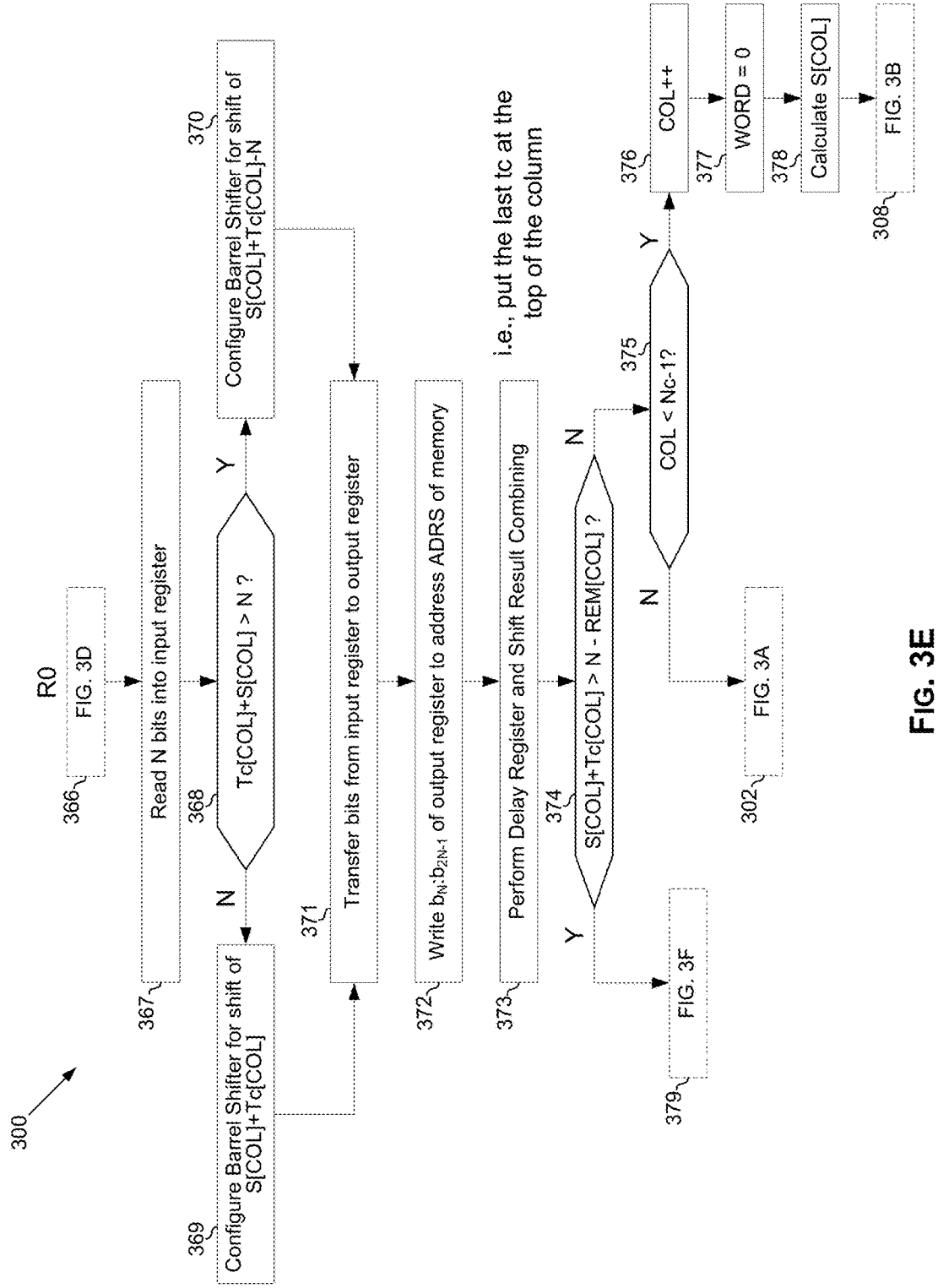

Now referring to FIG. 3E, a fifth state (which may be referred to as state "R0") is illustrated. After state entry block 366, the process advances to block 367 in which the bits of register 206 are copied into the register 204, and then N new bits of the data stream are input to register 206.

In block 368, it is determined whether Tc[COL]+S[COL] is greater than N. If not, then the process advances to block 369.

In block 369, shift control circuitry 210 is configured for a shift of S[COL]+Tc[COL] bits. After block 369, the process advances to block 371.

Returning to block 368, if Tc[COL]+S[COL] is not greater than N, then the process advances to block 370 in which shift control circuitry 210 is configured for a shift of S[COL]+Tc[COL]−N bits. After block 370, the process advances to block 371.

In block 371, bits of registers 204, 206, and 208 are transferred to register 212 and, in the process, shifted by either S[COL]+Tc[COL] bits, if block 371 was arrived at from block 369, or S[COL]+Tc[COL]−N if block 371 was arrived at from block 370.

In block 372, bits $b_N \ldots b_{2N-1}$ of register 212 are written to address (which corresponds to row number in the example implementation shown) ADRS of one of memory arrays 220 and 222. Which of the memory arrays 220 and 222 is used depends on whether a ping memory or pong memory of the interleaving matrix is currently being processed (e.g., even memory may be ping memory and odd memory may be pong memory).

In block 373, the last Tc bits of the column COL in the shifted result (last Tc bits of the column in 212) needs to be combined with the N−Tc bits of the data previously stored in 216 during state W0 (block 324 and 334) and update the delay register 216. The content in delay register 216 will be written to the address COL−1 in the next W0 state (block 322 or 332) or address Nc−1 the end of interleaving.

In block 374, it is determined whether S[COL]+Tc[COL] is greater than N−REM[COL]. If so, then the process advances to block 379 and the state machine advances to state R1, described with reference to FIG. 3F. If not, then the process advances to block 375.

In block 375, it is determined whether the COL variable is less than Nc−1. That is, whether all columns of the interleaving matrix 100 have been written to memory 220 or 222. If not, the process returns to block 302 (FIG. 3A). If so, the process advances to block 376.

In block 376, the COL variable is incremented, and then in block 377 the WORD variable is reset to 0. In block 378 S[COL] is calculated. After block 378, the process advances to block 308 (FIG. 3B).

Figure 3F:
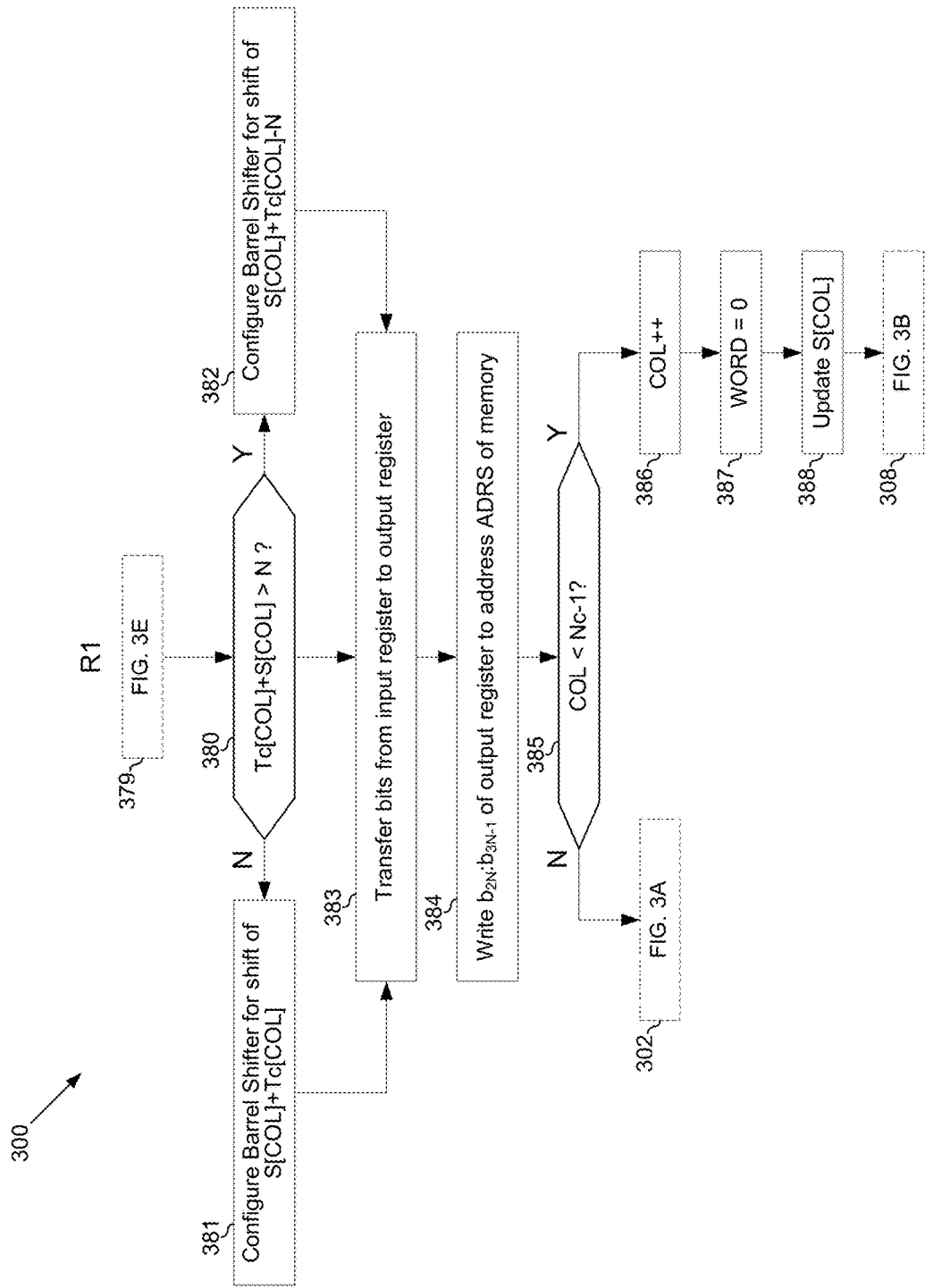

Now referring to FIG. 3F, a sixth state (which may be referred to as state "R1") is illustrated. After state entry block 379, the process advances to block 380 in which it is determined whether Tc[COL]+S[COL] is greater than N. If not, then the process advances to block 381.

In block 381, shift control circuitry 210 is configured for a shift of S[COL]+Tc[COL] bits. After block 381, the process advances to block 383.

Returning to block 380, if Tc[COL]+S[COL] is not greater than N, then the process advances to block 382 in which shift control circuitry 210 is configured for a shift of S[COL]+Tc[COL]−N bits. After block 382, the process advances to block 383.

In block 383, bits of registers 204, 206, and 208 are transferred to register 212 and, in the process, shifted by either S[COL]+Tc[COL] bits, if block 383 was arrived at from block 381, or S[COL]+Tc[COL]−N if block 383 was arrived at from block 382.

In block 384, bits $b_{2N} \ldots b_{3N-1}$ of register 212 are written to address (which corresponds to row number in the example implementation shown) ADRS of one of memory arrays 220 and 222. Which of the memory arrays 220 and 222 is used depends on whether a ping memory or pong memory of the interleaving matrix is currently being processed (e.g., even memory may be ping memory and odd memory may be pong memory).

In block 385, it is determined whether the COL variable is less than Nc−1. That is, whether all columns of the interleaving matrix 100 have been written to memory 220 or 222. If not, the process returns to block 302 (FIG. 3A). If so, the process advances to block 386.

In block 386, the COL variable is incremented, and then in block 387 the WORD variable is reset to 0. In block 388 S[COL] is calculated. After block 388, the process advances to block 308 (FIG. 3B).

Figure 4:
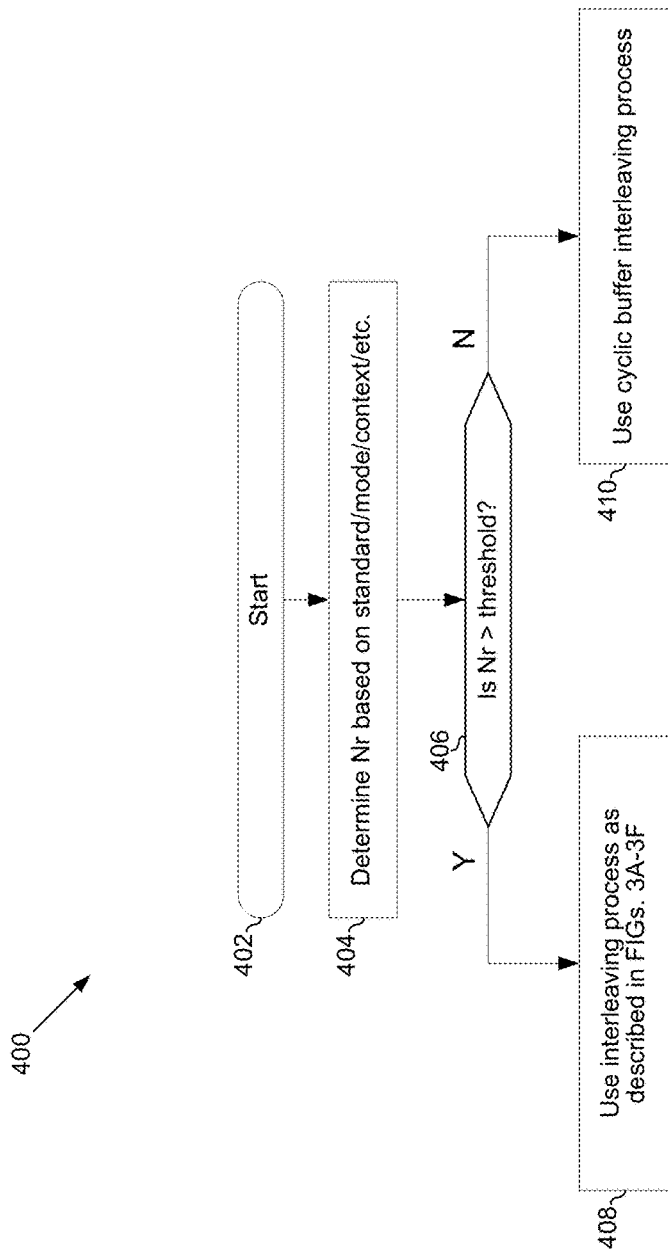
FIG. 4 illustrates a process for selecting an interleaving mode.

FIG. 4 illustrates a process for selecting an interleaving mode. The process begins with start block 402 and proceeds to block 404 in which the value of parameter Nr is determined based on a standard to be adhered to, a mode of operation to be used, and/or other context information (such as the type of data to be interleaved, the type of connection over which the data is to be received, etc.).

In block 406, if the value of Nr determined in block 404 is not less than a determined threshold, then the process advances to block 408. If the value of Nr determined in block 404 is less than the determined threshold, then the process advances to block 410.

In block 408, the interleaving process described above with reference to FIGS. 3A-3F is used for interleaving.

In block 410, the interleaving is performed using a small cyclic buffer. That is, Nr data units are written into a buffer, the buffer is cyclically shifted to move the last Tc bits to the front of the buffer, and then the contents of the buffer are written to ping or pong memory 220 or 222.

The reason for the threshold test in block 406 is that for very small Nr (3N or less in the case) the data length is shorter than the state transition and control timing requirement and the hardware cost for this exception handling is low. For large N and very large Nr, which is a typical case, the scheme presented previously can significantly reduce the required buffer size and the happen of stalls.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
   one or more circuits configured for applying parallel bit-interleaving, said one or more circuits comprising:
   an input register operable to store a number of bits read from an input bitstream into an input buffer, wherein a size of said read bits is based on a first interleaving parameter;
   a shifter circuit operable to apply a shift to a combination of bits corresponding to:
   said read bits, stored in said input register, and,
   additional bits corresponding to previously received bits in said input bitstream and/or pre-set bits, wherein said shift is determined based on a second interleaving parameter;

an output register operable to store said shifted combination;

a delay-and-combine circuit operable to:
store bits previously received from said output register; and
apply an adjustment to bits stored within said delay-and-combine circuit;

a memory operable to store bits during processing of said input stream, wherein said stored bits are written from said output register or said delay-and-combine circuit; and an output buffer operable to read bits from said memory based on said first interleaving parameter, and to output bits based on a third interleaving parameter, for use in generating an interleaved output bitstream corresponding to said input bitstream.

2. The system of claim 1, wherein said memory comprises at least two separate memory portions configured to operate concurrently during read and write operations.

3. The system of claim 2, wherein, during read and write operations, data is written into a first one of said at least two separate memory portions while data is read from a second one of at least two separate memory portions into said output buffer.

4. The system of claim 1, wherein said output buffer comprises at least two separate buffer portions configured to operate concurrently during read and write operations.

5. The system of claim 1, wherein said output buffer is operable to, in each of a cycle, read a number of bits corresponding to said size of read bits and output an interleaved set of bits having a size based on a number of columns of an interleaving matrix used during said parallel bit-interleaving.

6. The system of claim 5, wherein a number of bits read from said output buffer, for outputting as said interleaved output bitstream, is configurable based on one or more interleaving parameters.

7. The system of claim 5, comprising a conversion circuit operable to convert interleaved sets of bits read out from said output buffer into one or more sets of bits each having a size corresponding to a size of a first interleaving parameter.

8. The system of claim 5, comprising a buffer circuit operable to buffer bits read out from said output buffer for outputting bits corresponding to said interleaved output bitstream.

9. The system of claim 8, wherein said buffer circuit comprises a one-dimensional (1D) first-in-first-out (FIFO) buffer.

10. The system of claim 1, comprising a control circuit that is operable to generate one or more control signals for controlling operations of at least one of said one or more circuits during interleaving functions.

11. The system of claim 1, wherein said delay-and-combine circuit operable is to apply said adjustment is applied when one or more conditional criteria are met, the one or more conditional criteria comprising completing processing of a full column.

12. The system of claim 1, wherein said first interleaving parameter is based on a level of parallelism for said parallel bit-interleaving.

13. The system of claim 1, wherein said second interleaving parameter is determined based on one or more of: a column twist associated with a current column of an interleaving matrix used during said parallel bit-interleaving, a starting parameter for said current column in said interleaving matrix, and said first interleaving parameter.

14. The system of claim 1, wherein said third interleaving parameter comprises a number of columns of an interleaving matrix used during said parallel bit-interleaving.

15. A method comprising:
applying to an input bitstream, parallel bit-interleaving, wherein said applying of parallel bit-interleaving comprises, in each one of a plurality of cycles:
reading a number of bits from said input bitstream, wherein a size of said read bits is based on a first interleaving parameter;
processing said read bits, said processing comprises applying a shift based on a second interleaving parameter to a combination of bits that comprises:
said read bits, and
additional bits corresponding to previously read bits in said input bitstream and/or pre-set bits;
buffering said shifted combination of bits;
applying an adjustment to a combination of bits comprising bits corresponding to previously read bits, wherein said adjustment is applied when one or more conditional criteria are met, the one or more conditional criteria comprising completing processing of a full column;
storing into a memory a number of bits corresponding to said shifted combination of bits and/or said adjusted combination of bits; and
reading a number of bits from said memory into an output buffer based on said first interleaving parameter; and
outputting a number of bits from said output buffer based on a third interleaving parameter; and
generating an interleaved output bitstream corresponding to said input bitstream, using bits outputted from said output buffer.

16. The method of claim 15, comprising managing said memory to enable concurrent read and write operations.

17. The method of claim 16, wherein said concurrent read and write operations comprises writing data into a first memory portion while data is read from a second memory portion into said output buffer.

18. The method of claim 15, comprising managing said output buffer to enable concurrent read and write operations when reading said bits to generate said interleaved output bitstream.

19. The method of claim 15, comprising, in one cycle, writing into said output buffer a number of bits corresponding to said size of read bits and reading from said output buffer an interleaved set of bits having a size based on a number of columns of an interleaving matrix used during said parallel bit-interleaving.

20. The method of claim 18, comprising configuring said number of bits read from said output buffer based on one or more interleaving parameters.

21. The method of claim 18, comprising converting interleaved sets of bits each having a size based on said third interleaving parameter, read out from said output buffer, into sets of bits each having a size corresponding to said size of first interleaving parameter.

22. The method of claim 18, comprising buffering bits read out from said output buffer for outputting bits corresponding to said interleaved output bitstream.

23. The method of claim 15, comprising generating one or more control signals for controlling interleaving operations and/or functions.

24. The method of claim 15, comprising controlling interleaving operations and/or functions based on preset interleaving state machine.

25. The method of claim 15, comprising applying said adjustment to said combination of bits when one or more conditional criteria are met, the one or more conditional criteria comprising completing processing of a full column.

26. The method of claim 15, wherein said first interleaving parameter is based on a level of parallelism for said parallel bit-interleaving.

27. The method of claim 15, comprising determining said second interleaving parameter based on one or more of: a column twist associated with a current column of an interleaving matrix used during said parallel bit-interleaving, a starting parameter for said current column in said interleaving matrix, and said first interleaving parameter.

28. The method of claim 15, wherein said third interleaving parameter comprises a number of columns of an interleaving matrix used during said parallel bit-interleaving.

\* \* \* \* \*